United States Patent
Behringer et al.

(10) Patent No.: US 8,094,694 B2
(45) Date of Patent: Jan. 10, 2012

(54) OPERATING A PULSE LASER DIODE

(75) Inventors: Martin Rudolf Behringer, Regensburg (DE); Josip Maric, Sinzing (DE); Stefan Morgott, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 44 days.

(21) Appl. No.: 12/211,939

(22) Filed: Sep. 17, 2008

(65) Prior Publication Data

US 2009/0074021 A1  Mar. 19, 2009

(30) Foreign Application Priority Data

Sep. 18, 2007 (DE) .................. 10 2007 044 438

(51) Int. Cl.
*H01S 3/04* (2006.01)
(52) U.S. Cl. .................. 372/34; 372/36; 372/50.1
(58) Field of Classification Search .............. 372/34, 372/36, 50.1
See application file for complete search history.

(56) References Cited

U.S. PATENT DOCUMENTS

| 4,092,614 A | 5/1978 | Sakuma et al. |
| 5,400,351 A * | 3/1995 | Montgomery et al. ......... 372/34 |
| 2005/0117616 A1* | 6/2005 | Yamasaki et al. ............... 372/44 |
| 2005/0199890 A1* | 9/2005 | Morgott et al. ................. 257/80 |
| 2006/0045145 A1 | 3/2006 | Arahira |

FOREIGN PATENT DOCUMENTS

| DE | 30 05 645 | 8/1981 |
| DE | 10 2005 004 145 | 9/2005 |
| EP | 0 957 596 | 11/1999 |
| GB | 2 224 374 | 5/1990 |
| JP | 3-283585 | 12/1991 |
| WO | WO 93/18563 | 9/1993 |

* cited by examiner

*Primary Examiner* — Kinam Park
(74) *Attorney, Agent, or Firm* — Fish & Richardson P.C.

(57) ABSTRACT

Circuit arrangements for the operation of a pulse laser diode and methods for operating a pulse laser diode include a current source to supply a direct current to the pulse laser diode. The circuit arrangement can provide operation of the pulse laser diode that can be stable and without unintentional shifts in wavelength.

8 Claims, 4 Drawing Sheets

OPERATING A PULSE LASER DIODE

CROSS REFERENCED TO RELATED APPLICATION

Under 35 U.S.C. §119, this application claims the benefit of a foreign priority of German patent application 102007044438.0, filed Sep. 18, 2007, the disclosed contents of which are hereby incorporated by reference in its entirety.

TECHNICAL FIELD

The invention relates to a circuit arrangement for the operation of a pulse laser diode, the pulse laser diode being supplied with current. In addition, the invention also relates to a method for operating the pulse laser diode.

BACKGROUND

A device having a semiconductor component emitting radiation, with at least an electrical heating element being associated with the semiconductor component is known from the document DE 10 2005 004 145 A1.

SUMMARY

One object to be achieved is to present a circuit arrangement for the operation of a pulse laser diode, by means of which a pulse laser diode can be operated with as much stability as possible.

A circuit arrangement for the operation of a pulse laser diode is presented, which comprises a pulse laser diode. In addition, a current source is provided, which is suitable for supplying a direct current to the pulse laser diode.

The temperature of the laser diode chip can be influenced by means of the supplied direct current. In this way, the temperature can be controlled within certain boundaries.

In a preferred embodiment of the circuit arrangement, a means is provided which serves to limit the current supplied to the pulse laser diode. The current is preferably limited to a value which is lower than the lasing threshold of the pulse laser diode.

This has the advantage that the supplied direct current does not influence the generation of radiation by the pulse laser diode since the value lies below the lasing threshold of the pulse laser diode. In this way, it can be achieved that the operation of the pulse laser diode according to the radiation can be ensured using means independent of the current source. The direct current is thus not used to pump the pulse laser diode.

This further results in the advantage that the energy of the supplied direct current is in large part available for the generation of heat within the pulse laser diode. By this means, controlled heat can be generated in the pulse laser diode or in the pulse laser diode chip, with which the temperature of the pulse laser diode can be influenced at the same time.

Influencing the temperature of the pulse laser diode has the advantage that, with the use of further suitable means which are described below, the temperature can be kept within certain boundaries. In this way, an uncontrolled and unintended drifting of the temperature of the pulse laser diode can be prevented. It can thus be achieved that the pulse wavelength at which the pulse laser diode emits its radiation can be kept within certain boundaries in a stable manner. Preferably, pulse laser diodes whose peak wavelength of the emitted radiation is dependent on the temperature of the pulse laser diode chip are used in the circuit arrangement.

For example, pulse laser diodes whose emission wavelength or pulse wavelength varies by +0.3 nm per Kelvin temperature difference can be used.

This enables the use of the pulse laser diode particularly in automotive applications where they are used in sensors for measuring distance. Since the pulse wavelength of the pulse laser diode can be kept as constant as possible, the receiver of the light radiated by the pulse laser diode can always operate at a good or even the optimal operating point.

In addition, the use of the pulse laser diode described here, together with the associated circuit arrangement, enables the use of narrow-band filters before the receiver or detector, with which environmental or stray light can be very well suppressed, and with which the signal-to-noise ratio can also be kept high.

According to one embodiment of the circuit arrangement for the operation of a pulse laser diode, the current source is suitable to supply a current to the diode sufficient to raise the temperature in the diode chip by at least 10 K.

This results in the advantage that the temperature of the pulse laser diode can vary within a significant range, which results in extended possibilities for control.

According to one embodiment, it is further provided that a measuring device is comprised by the circuit arrangement, which is provided to determine the temperature of the pulse laser diode. Using such a measuring device, with the suitable selection of a current source, control of the temperature of the pulse laser diode is possible, which can be used, for example, to keep the temperature of the pulse laser diode and thus the peak wavelength of the light radiated by the pulse laser diode as constant as possible.

To this end, according to one embodiment of the circuit arrangement, the measuring device is coupled with the current source, the current supplied to the pulse laser diode being controllable by an electrical signal. The control of the current supplied to the pulse laser diode is preferably achieved by a signal that is dependent on the measured temperature of the pulse laser diode.

In addition, a method is presented for operating a pulse laser diode, in which a direct current is supplied to the pulse laser diode to adjust its temperature to a specified value.

Such a method can, for example, be achieved using the described circuit arrangement.

In a particular advantage of the method for operating a pulse laser diode, the temperature of the pulse laser diode is kept constant by means of a suitable regulating device.

Furthermore, a method for operating a pulse laser diode is presented, in which the pulse wavelength of the pulse laser diode is controlled by the supply of a direct current to the pulse laser diode.

This has the advantage that by supplying the current to the pulse laser diode and, in association, heating the pulse laser diode by simple means, it is possible to control the wavelength of the light emitted by the pulse laser diode.

In particular, the temperature of the pulse laser diode can be adjusted by the level of the direct current, since the temperature of the pulse laser diode rises with the supplied current.

According to one embodiment of the circuit arrangement or the method for operating the pulse laser diode, the supplied current is kept constant in order to heat the pulse laser diode and keep it at a constant temperature, independent of the development of the external temperature in the environment.

The circuit arrangement for operating a pulse laser diode and the method for operating a pulse laser diode is described in greater detail below based on exemplary embodiments and the figures associated with them.

DESCRIPTION OF DRAWINGS

The figures are not to be perceived as being to scale; rather individual dimensions may be depicted elongated or abbreviated or even distorted for purposes of better illustration. Elements that perform the same function are indicated with the same reference numbers.

DETAILED DESCRIPTION

Figure 1:
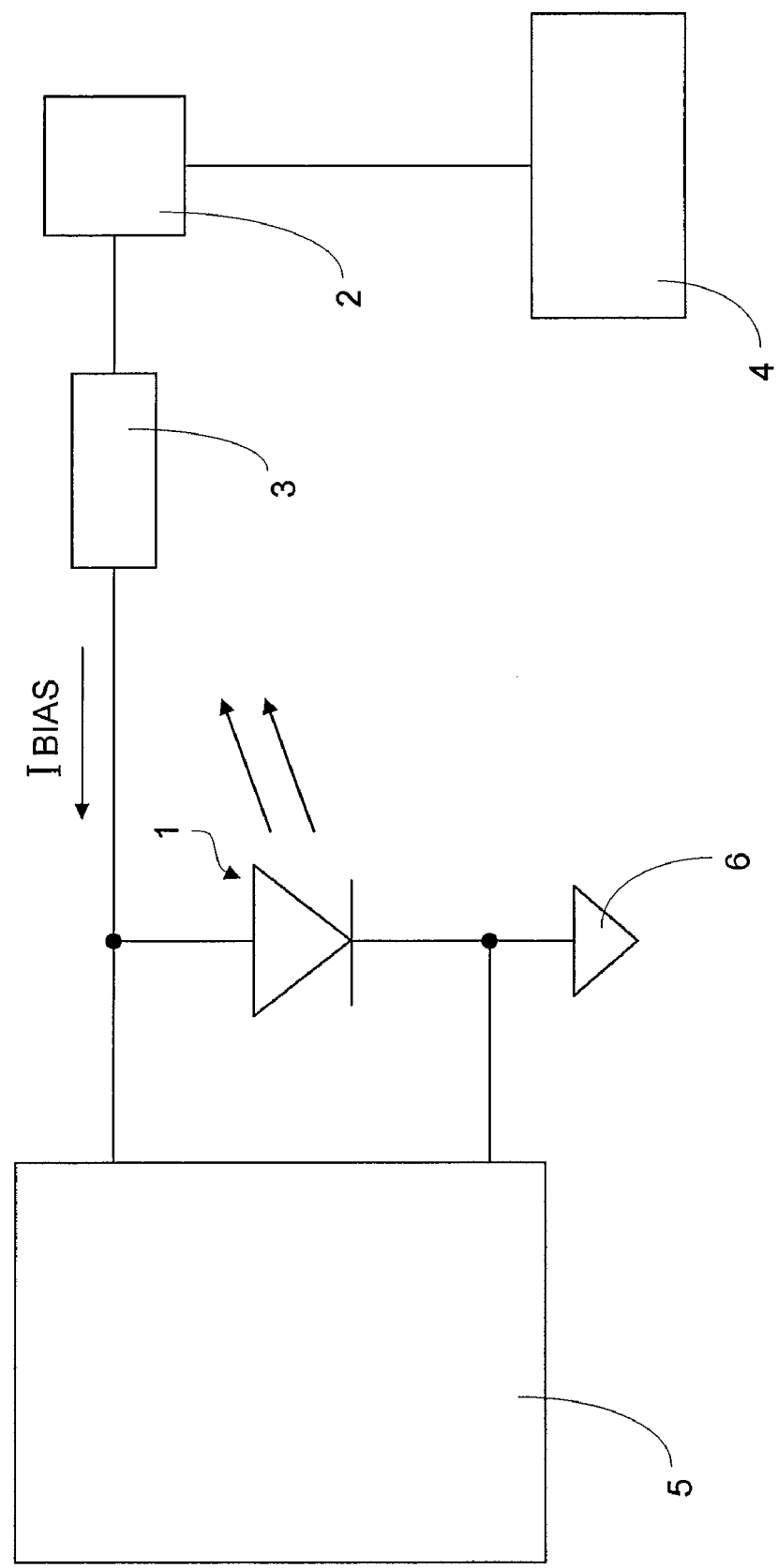
FIG. 1 shows a schematic depiction of a circuit arrangement for the operation of a pulse laser diode.

FIG. 1 shows a circuit arrangement for the operation of a pulse laser diode, a pulse laser diode 1 being provided. A pulser circuit 5 is used to operate the pulse laser diode. In the exemplary embodiment shown in FIG. 1, the pulse laser diode is model SPL PL90.

The pulser circuit is designed such that it can supply a current of 30 A to the pulse laser diode 1. The current pulses have a pulse duration of 100 ns and are supplied to the pulse laser diode 1 with a frequency of 1 kHz.

In addition, a direct current source 2 is provided, which supplies a direct current to the pulse laser diode 1. The direct current preferably flows through a current limiting means 3, which, for example, can be an ohmic resistor. In the example of FIG. 1, a resistor of 100Ω is used for the current limiter 3. The current source in the example from FIG. 1 provides a supply voltage between 0 V and 16.5 V, which leads, with a resistance of 100Ω, to a direct current of between 0 and 150 mA, which flows through the current source 2, the current limiter 3, the laser diode 1 and finally to the ground connection 6.

Additionally, a temperature measuring device 4 is provided, which can be coupled with the current source by means of an electric line, for example.

The measured values supplied by the temperature measuring device 4 relating to the temperature of the pulse laser diode 1 can be used to control the current source 2.

Figure 2:
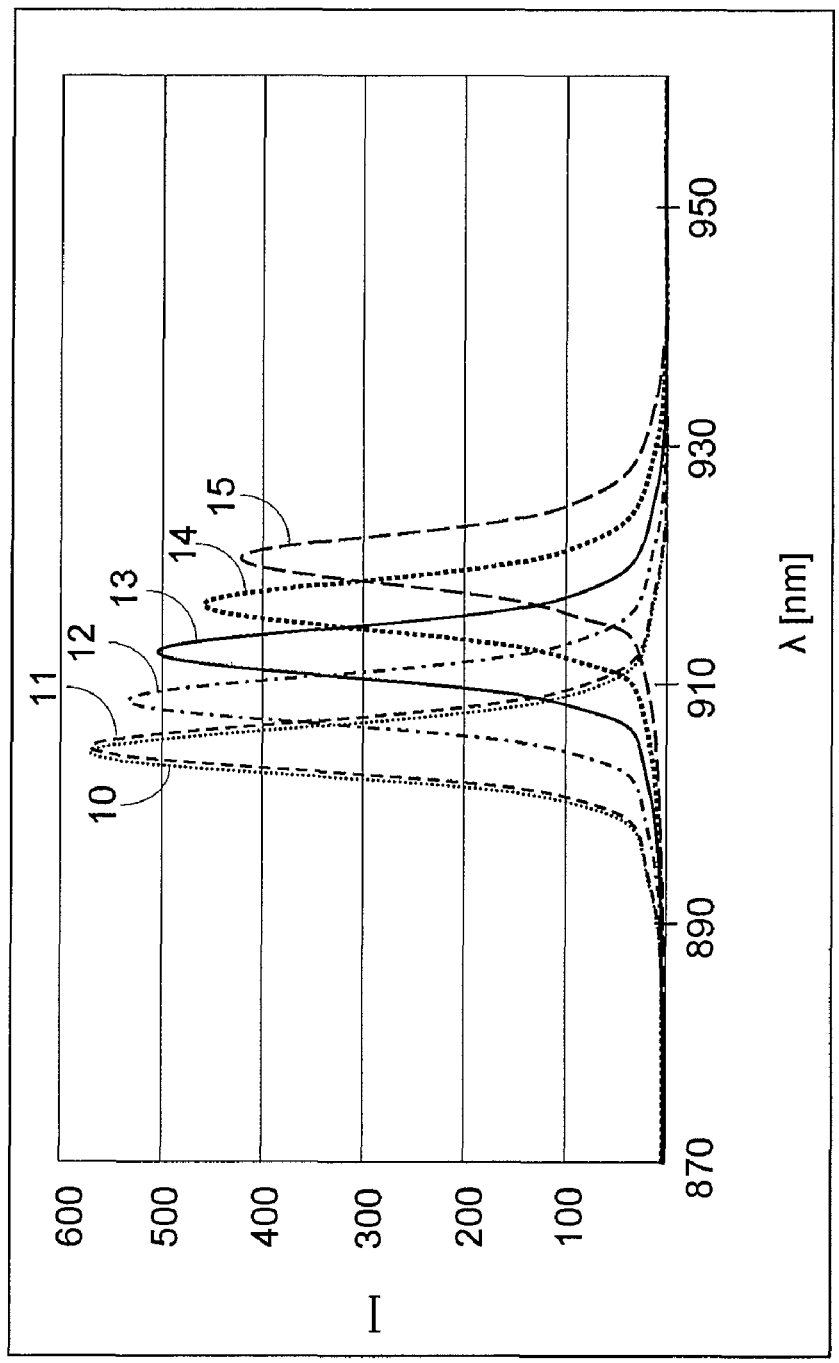
FIG. 2 shows the radiation emitted by the pulse laser diode in dependence on the direct current supplied to the pulse laser diode.

FIG. 2 shows the optical intensity of the pulse laser diode measured in an arrangement according to FIG. 1 in dependence on the wavelength λ of the light emitted by the laser diode for various direct currents supplied to the pulse laser diode.

The curve 10 shows the optical intensity I in dependence on the wavelength λ for a direct current of 0 mA. The curve 11 shows the intensity for a direct current of 30 mA. The curve 12 shows the intensity for a direct current of 60 mA. The curve 13 shows the intensity for a direct current of 90 mA. The curve 14 shows the intensity for a direct current of 120 mA. The curve 15 shows the intensity for a direct current of 150 mA.

It can be seen from FIG. 2 that a significant shift in the radiation pulse emitted by the pulse laser diode along the wavelength axis is possible.

This shows that the wavelength of the pulse laser diode can be controlled by the current source using the circuit arrangement described here.

Figure 3:
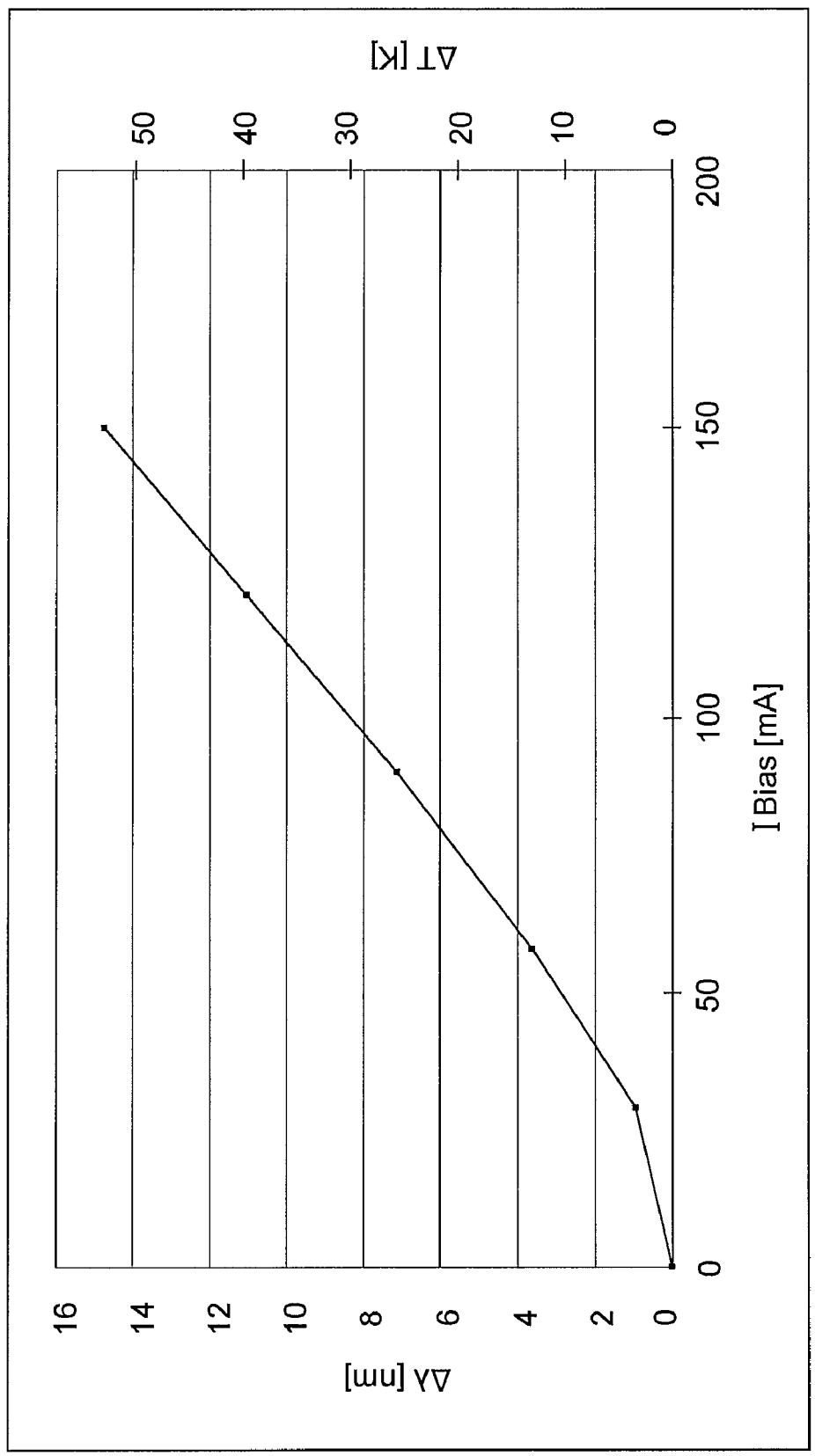
FIG. 3 shows the dependence of the wavelength shift and the dependence of the temperature change of the pulse laser diode in dependence on the direct current supplied.

FIG. 3 shows the change in the pulse wavelength as shown in FIG. 2, in dependence on the supplied direct current. In addition, FIG. 3 shows the change in temperature ΔT in dependence on the supplied direct current IBIAS.

It can be seen from FIG. 3 that at least from a supplied current of about 50 mA, an approximately proportionate relationship exists between the supplied direct current and the wavelength change Δλ on one hand and the supplied direct current IBIAS and the temperature change ΔT on the other hand. This shows that the control of the wavelength of the emitted light and the control of the temperature of the pulse laser diode is very simple and is possible without great circuit or calculation effort.

Figure 4:
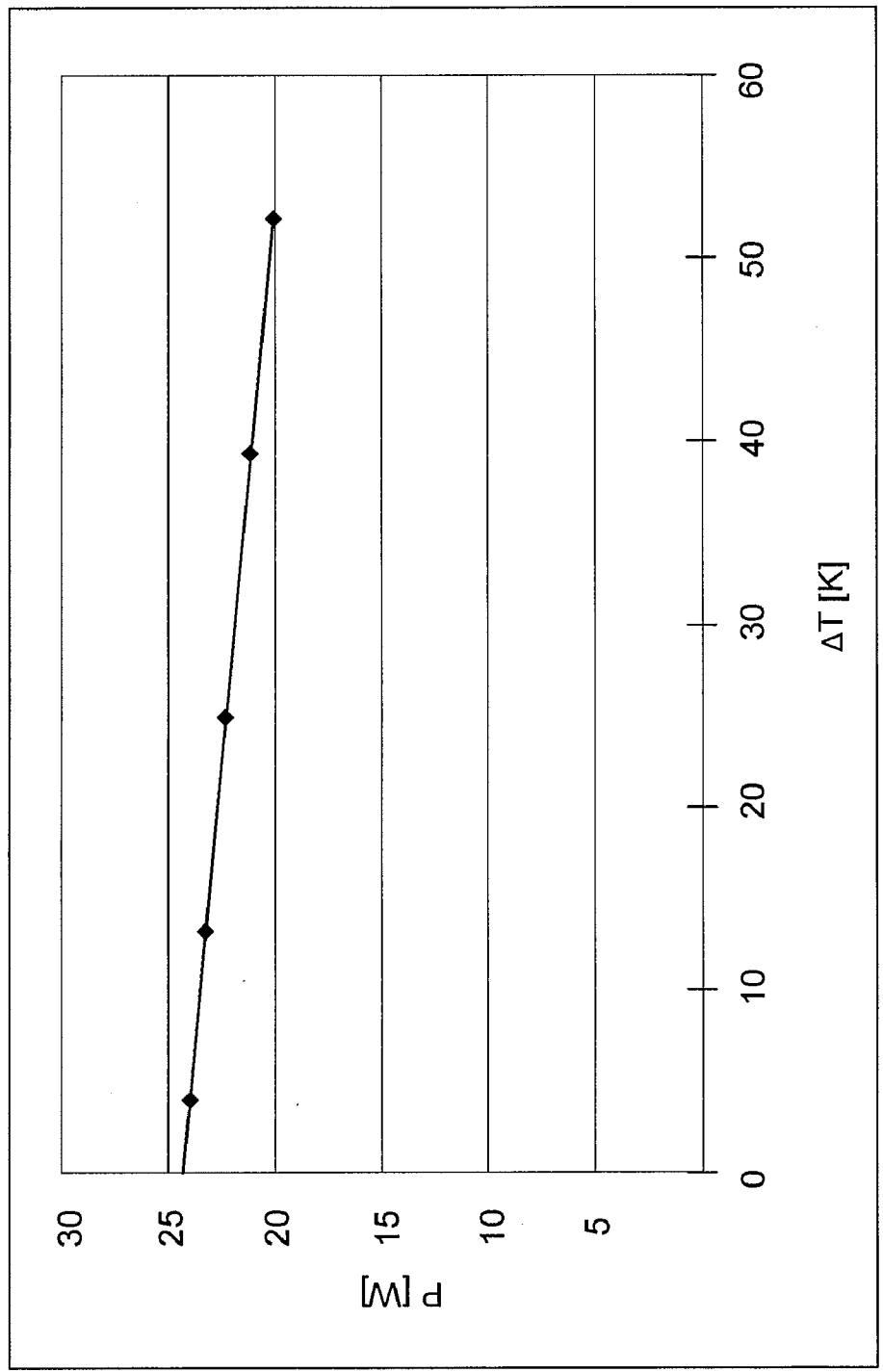
FIG. 4 shows the optical performance of the pulse laser diode in dependence on the temperature change of the pulse laser diode.

FIG. 4 shows the dependence of the optical performance P of the pulse laser diode in dependence on the temperature increase ΔT of the pulse laser diode. Here too there is a linear relationship, a very slight dependence of the optical performance on the temperature increase being determinable with an increase of −0.08 W/K. This shows that the operation of a pulse laser diode at an increased temperature can be very stable and without major losses with respect to the optical performance P.

The invention is not restricted to the exemplary embodiments by the description based thereon. Rather, the invention comprises each new characteristic as well as each combination of characteristics, which particularly includes each combination of characteristics in the patent claims, even if this characteristic or this combination itself is not explicitly specified in the patent claims or exemplary embodiments.

What is claimed is:

1. A method for operating a pulse laser diode, the method comprising:
    supplying a direct current to the pulse laser diode to adjust its temperature to a specified value,
    limiting the direct current to a value that is lower than a lasing threshold of the pulse laser diode, whereby the direct current is limited by a current limiter;
    determining a temperature of the pulse laser diode using a temperature measurement device; and
    controlling a current source based on values measured by the temperature measuring device;
    wherein supplying the direct current comprises supplying the pulse laser diode with a current which is adequate to achieve a temperature increase of at least 10 K in a chip of the laser diode.

2. The method of claim 1, wherein supplying the direct current comprises supplying the direct current with a current intensity of at least 30 mA and no more than 150 mA.

3. A method for operating a pulse laser diode, the method comprising:
    keeping a temperature of the pulse diode laser constant by means of a regulating device,
    limiting a direct current supplied the pulse laser diode to a value that is lower than a lasing threshold of the pulse laser diode, whereby the direct current is limited by a current limiter;
    supplying the pulse laser diode with the direct current which is adequate to achieve a temperature increase of at least 10 K in a chip of the laser diode; and controlling a current source supplying the pulse laser diode with the direct current based on values measured by a temperature measuring device coupled to the current source.

4. A method for operating a pulse laser diode, the method comprising:

controlling a pulse wavelength (λ) of the pulse laser diode by supplying a direct current to the pulse laser diode, controlling a current source supplying the pulse laser diode with the direct current based on values measured by a temperature measuring device coupled to the current source, and limiting the direct current supplied the pulse laser diode to a value that is lower than a lasing threshold of the pulse laser diode, whereby the direct current is limited by a current limiter, wherein the direct current supplied to the pulse laser diode is adequate to achieve a temperature increase of at least 10 K in a chip of the laser diode.

5. A circuit arrangement for the operation of a pulse laser diode, the circuit arrangement comprising:

a pulser circuit, which supplies a current to the pulse laser diode;

a current source which supplies a direct current to the pulse laser diode, wherein the pulser circuit and the current source are separated from each other such that the pulser circuit is electrically connected to the pulse laser diode by a first electrical path and the current source is electrically connected to the pulse laser diode by a second electrical path that is different than the first electrical path;

a temperature measuring device which is coupled with the current source by means of an electric line, wherein measured values supplied by the temperature measuring device relating to the temperature of the pulse laser diode are used to control the current source such that the current source supplies the pulse laser diode with a current which causes a temperature increase of at least 10 K in a chip of the pulse laser diode.

6. The circuit arrangement of claim 5, the direct current being supplied with a current intensity of at least 30 mA and no more than 150 mA.

7. A circuit arrangement of claim 5, wherein a pulser circuit is used to operate the pulse laser diode.

8. A circuit arrangement of claim 7, wherein the direct current and the current provided by the pulser circuit are supplied separately to the pulse laser diode.

* * * * *